United States Patent [19]

Collins et al.

[11] 4,146,917
[45] Mar. 27, 1979

[54] PHOTOFLASH LAMP ARRAY HAVING REFLECTIVE COATING MEANS

[75] Inventors: Edward J. Collins, Mentor-on-the-Lake; Vaughn C. Sterling, Cleveland Heights; Harihar D. Chevali, Mentor, all of Ohio

[73] Assignee: General Electric Company, Schenectady, N.Y.

[21] Appl. No.: 825,604

[22] Filed: Aug. 18, 1977

[51] Int. Cl.² ............................................. G03B 15/02
[52] U.S. Cl. ................................... 362/10; 362/13; 362/16; 362/247
[58] Field of Search ...................... 362/10, 16, 13, 247

[56] References Cited

U.S. PATENT DOCUMENTS

| | | | |
|---|---|---|---|
| 3,894,226 | 7/1975 | Hanson | 362/11 |
| 3,952,320 | 4/1976 | Blount | 362/11 |

*Primary Examiner*—Stephen J. Lechert, Jr.
*Attorney, Agent, or Firm*—John F. McDevitt; Lawrence R. Kempton; Frank L. Neuhauser

[57] ABSTRACT

Reflecting coating means are provided to replace the conventional reflector cavities surrounding each photoflash lamp of a multilamp photoflash array. A reflective adhesive coating for this purpose can be applied to each photoflash lamp around a portion of the lamp circumference to reflect the light outwardly in a desired direction. A reflective adhesive coating can also be applied to the circuit board member used with a photoflash lamp array to provide sequential firing of flash lamps as an alternate means to provide the desired light reflection and without need for individual lamp processing in achieving this result. The coating material comprises light reflective particulate solids bonded to the substrate with an adhesive binder.

2 Claims, 2 Drawing Figures

PHOTOFLASH LAMP ARRAY HAVING REFLECTIVE COATING MEANS

This application relates to co-pending application Ser. No. 825,607, filed Aug. 18, 1977, in the name of H. Chevali and assigned to the assignee of the present invention. In a further co-pending application Ser. No. 751,537, filed Dec. 16, 1976, the name of D. H. Green et al, and assigned to the present assignee, there is disclosed an electrically insulative adhesive coating for a circuit board use with a photoflash lamp array to provide sequential firing of the flash lamp and the coating material for this purpose can be an organic polymer binder.

BACKGROUND OF THE INVENTION

Multilamp photoflash lamp assemblies comprised of a reflector unit having a plurality of adjacent reflectors or reflector cavities each having a photoflash lamp mounted therein are well-known in the art. The conventional flash cube is one well-known embodiment of such photoflash lamp arrays. Linear-type photoflash lamp arrays are also well-known in the art wherein a series of reflectors are arranged in one or more rows which may face in the same direction to form a single-sided array or in opposite directions to form a two-sided array. In U.S. Pat. No. 3,952,320, to Richard Blount, there is also disclosed a multiple flash lamp arrangement having the lamps connected to a circuit board which carries the sequential firing circuitry and is provided with a pair of connectors for attachment of the flash lamp array to a camera. The individual flash lamps are disposed in the associated reflector cavities and arranged for sequential firing in two rows of four lamps, one above the other. The flash lamps are electrically connected in such a way that fires the upper group of four lamps when a tab connector at one end of the array is inserted in the camera. By turning said arrangement 180° and reinserting the remaining connector at the opposite end of said array into the flash lamp socket, the remaining group of four flash lamps can be ignited; and such an arrangement eliminates or reduces the undesirable "red-eye" effect.

Understandably, the cost of manufacturing and assembling the individual reflector cavities represents a significant portion of the total cost for such multilamp photoflash arrays and can require the further use of specialized electrical insulation as disclosed in the above-referenced Ser. No. 751,537 application to prevent electrical shorting of associated sequential firing circuitry by reason of the electrically conducting nature of the reflector cavities now in use. Alternate reflector means which are not subject to the same disadvantages represents a desirable improvement still being sought.

SUMMARY OF THE INVENTION

It has now been discovered, surprisingly, that an adhesive coating having sufficient reflective particulate solids dispersed therein serves adequately to reflect the light being emitted from adjacent flash lamps in the desired direction whether being employed as a flat reflecting surface located rearwardly from said flash lamps or as a coating disposed on the individual flash lamp envelopes. Specifically, the desired cooperation of projecting light forwardly from the the reflecting surface by diffuse reflection provides more reflected light than a polished metal surface of comparable shape. Known pigments or fillers to provide the desired diffuse reflection can be selected from the class of non-electrically conductive particulate materials such as metal oxides including silicon dioxide, titanium dioxide, and alumina, in order to retain an insulative nature when suspended in an organic polymer binder. The present reflective means can thereby simply comprise an organic polymer film containing approximately 80% by weight or more of the light reflective particulate solids and which has been adhesively bonded to the circuit board or lamp envelope substrate. By having said reflective means desposited directly upon the circuit board, there is further provided an electrically insulative coating to prevent electrical shorting of the underlying circuitry.

DESCRIPTION OF THE PREFERRED EMBODIMENTS

Figure 1:
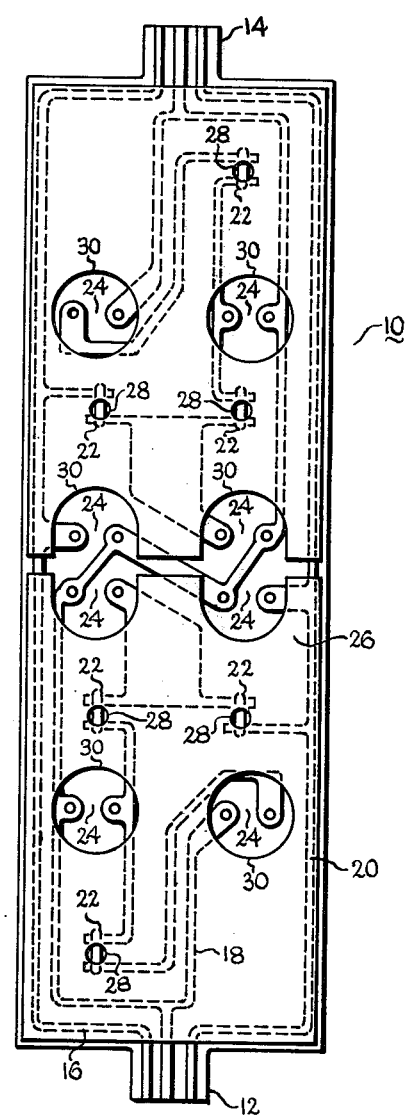
FIG. 1 is an illustration of a known multiple flash lamp circuit board having the light reflective adhesive coating according to the present invention.

The circuit arrangement of FIG. 1 is generally the same as disclosed in the above referenced United States patents and pending applications which includes the circuit board member 10 having connector tabs 12 and 14 located at each end for insertion of the circuit board to an associated camera socket (not shown). The camera socket has electrical contacts for conductor lines 16, 18 and 20 of the circuit board for connection of four flash lamps in parallel between conductor lines 16 and 18 when connector tab 12 has been inserted in the camera socket. Correspondingly, the remaining group of four lamps is connected between conductor lines 18 and 20 when connector tab 14 has been inserted into the camera socket. Conductor lines 16 and 20 are interrupted by radiation switches 22 to prevent the flash lamps in each group from all being fired together upon release of the camera shutter. As can be noted, the switches 22 are arranged in the region of a flash lamp termination 24 so that the heat and light released when the flash lamp is fired operates to convert the respective switch from a non-conductive to an electrically-conductive state, thus establishing a current path to the next lamp to be flashed.

A reflective adhesive coating 26 is deposited on the circuit board pattern in the form of a continuous layer which overlies the entire circuit board except for radiation transfer openings 28 to permit radiation transfer from the flash lamps to the underlying radiation-sensitive switch devices. A further series of openings 30 is provided permitting electrical termination of the flash lamps (not shown) to the underlying circuitry. Accordingly, when the particular flash lamp in the circuit is flashed, then the adjacent radiation switches are actuated providing a current path to the next lamp to be flashed. Each of the radiation switches are in contact with and bridge across the conductor lines of the electrical circuit with the material employed in the radiation switch initially having an open circuit or high resistance condition and with said resistance thereafter becoming zero or a low value when the material receives radiation and/or heat from an adjacent flash lamp upon firing of said lamp. A more detailed description of the sequential firing operation for said electrical circuit is found in the aforementioned United States patent, hence need not be repeated in the present application. Said reflective adhesive coating 26 is also desirably electrically insulative to prevent shorting of the underlying circuitry. The electrically insulating character of the adhesive coating can be provided with commercially available synthetic organic polymers having suspended therein light reflective particulate solids which are also electrically nonconductive such as the metal oxides and the like above disclosed.

Figure 2:
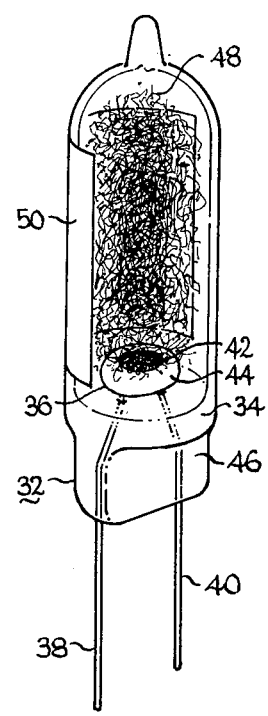
FIG. 2 is an illustration of one type flash lamp having said reflective coating desposited on the circumferential portion of the lamp envelope.

In FIG. 2 there is shown a high voltage-type flash lamp construction 32 comprising a hermetically sealed light-transmitting envelope 34 having flash ignition means 36 within said envelope which include a pair of spaced apart in-leads 38 and 40 along with a mass of primer material 42 being deposited on an insulator mount 44. Said tubular lamp envelope 34 has a stem pressed seal 46 and is partially filled with a loose mass of filamentary or shredded metal foil 48 along with a combustion-supporting atmosphere such as oxygen at super atmospheric pressures. A reflective adhesive coating 50 has been deposited on a portion of the circumferential periphery of the lamp envelope in a manner permitting forward light transmission without obstruction while also reflecting light which impinges upon the reflective surface in the same forward direction. When flash lamps having said reflective coatings are associated in a photoflash lamp array utilizing the circuit board configuration of FIG. 1, the light reflective adhesive coating 26 can be eliminated. A photoflash lamp array having the reflective coated flash lamps connected to the circuit board still supplies enough light in the rearward direction to actuate adjacent radiation-sensitive switch devices. It is also contemplated to employ said reflective coated flash lamps with a circuit board having an electrically insulative coating but which need not be reflecting since the underlying radiation-sensitive switches can still be actuated by light passage through openings 28.

While preferred embodiments of the invention have been shown and described, various other embodiments and modifications thereof will become apparent to persons skilled in the art, and thereby fall within the scope of the invention as defined by the following claims. For example, non-linear type flash lamp arrays can also be modified in accordance with the present invention.

What we claim as new and desire to secure by Letters Patent of the United States is:

1. In a photoflash lamp array having the individual flash lamps connected to a circuit board for sequential firing of said flash lamps by means of included radiation-sensitive switches, the improvement wherein said radiation-sensitive switches are coated with an electrically insulative adhesive coating to prevent shorting of the circuitry and said flash lamps are coated with an organic polymer film containing up to 80 percent or more by weight in said coating of light-reflective particulate solids which are electrically insulative and dispersed therein to reflect the light output from said flash lamps.

2. The photoflash lamp array of claim 1 wherein said circuit board coating includes openings to permit radiation transfer from the flashing lamps to the radiation-sensitive switches.

* * * * *